United States Patent [19]

Nakai et al.

[11] 4,319,155

[45] Mar. 9, 1982

[54] NEBULIZATION CONTROL SYSTEM FOR A PIEZOELECTRIC ULTRASONIC NEBULIZER

[75] Inventors: Hideharu Nakai, Nagaokakyo; Isao Kai, Kameoka; Hirohito Yamamoto, Kyoto, all of Japan

[73] Assignee: Omron Tateisi Electronics Co., Kyoto, Japan

[21] Appl. No.: 102,534

[22] Filed: Dec. 11, 1979

[30] Foreign Application Priority Data

Jan. 9, 1979 [JP] Japan .................................. 54-1836

[51] Int. Cl.[3] ............................................ H01L 41/08

[52] U.S. Cl. .................................. 310/316; 310/317; 128/200.16; 239/102

[58] Field of Search ................ 310/316, 317; 318/116, 318/118; 128/200.16; 239/102; 261/DIG. 48, 81

[56] References Cited

U.S. PATENT DOCUMENTS

| | | | |
|---|---|---|---|
| 2,453,595 | 11/1948 | Rosenthal | 310/317 X |
| 3,387,607 | 6/1968 | Gauthier et al. | 310/334 X |
| 3,490,697 | 1/1970 | Best, Jr. | 239/102 |
| 3,828,357 | 8/1974 | Koeblitz | 310/317 |
| 3,866,831 | 2/1975 | Denton | 239/102 X |
| 4,001,650 | 1/1977 | Romain | 128/200.16 X |
| 4,047,992 | 9/1977 | Williams | 310/317 X |

*Primary Examiner*—Mark O. Budd

*Attorney, Agent, or Firm*—Wegner & Bretschneider

[57] ABSTRACT

A nebulization control system for an ultrasonic nebulizer comprising a variable pulse oscillating circuit, an ultrasonic vibrating circuit and an ultrasonic vibrator is described. The ultrasonic vibrator is caused to vibrate alternatingly between a high level which is sufficient to nebulize a fluid and a low level which is insufficient to nebulize the same. The ratio of duration of the high level to the low level and/or the amplitude of vibration at the high level is variable. This arrangement permits a precise control of nebulization quantity and assists in the production of a fine, uniform mist of fluid.

5 Claims, 3 Drawing Figures

NEBULIZATION CONTROL SYSTEM FOR A PIEZOELECTRIC ULTRASONIC NEBULIZER

BACKGROUND OF THE INVENTION

This invention relates to a nebulization control system for an ultrasonic nebulizer and, more particularly, to a new control system, which can be applied to a device for nebulizing fluids with an ultrasonic energy, for precisely controlling the quantity of nebulization when a relatively small quantity of nebulization is required.

Recently, ultrasonic nebulizers for vaporizing fluids have been applied to humidifiers for increasing humidity in rooms, inhalation apparatuses for the treatment of respiratory diseases, beauty aids, etc.

In such ultrasonic nebulizers, especially those for inhalation therapy, narcotherapy, and humidity control in hospitals, it is required to precisely control the quantity of vaporization.

The ultrasonic nebulizer disclosed in U.S. Pat. No. 3,387,607 comprises essentially a pulse oscillating circuit and an electro-acoustic transducer or ultrasonic vibrator which is energized by the output of the circuit.

In such a nebulizer, nebulization quantity control is effected by changing the so-called duty factor, in other words, changing the cycle of oscillating time period of a pulse oscillating circuit or by changing the ratio of oscillating time period to non-oscillating time period of the pulse oscillating circuit so that the ultrasonic vibrator synchronized with the oscillation generates intermittantly ultrasonic waves of constant amplitude.

Since the time delay of nebulization after the beginning of ultrasonic vibration is approximately 0.4 second, the time period of ultrasonic vibration or pulse oscillation should be more than 0.4 second.

The nebulizer of U.S. Pat. No. 3,387,607, which changes the cycle of ultrasonic vibrating time period or the ratio of ultrasonic vibrating time period to ultrasonic non-vibrating time period with the amplitude of vibration being kept constant, has the disadvantage that a large rush current is unavoidable because the rapid increase and decrease of amplitude are involved between zero-level and nebulization-level of vibration amplitude.

Another disadvantage emanating from the rapid change of oscillation or vibration is that large sized fluid particles are produced and, especially when a small volume of fluid must be nebulized, scattering of fluid droplets is unavoidable and, hence, nebulization of uniform size fluid particles is difficult.

More particularly, in an inhalation apparatus for an inhalation therapy of respiratory tract diseases wherein the nebulized fluid medicament is inhaled, it is required to precisely control the nebulization quantity over the vast range from a very little quantity to a relatively great quantity depending on the condition of the patient.

A further disadvantage is that when the fluid medicament is of high viscosity, it is not only difficult to obtain a fine mist but also impossible to precisely control the nebulization quantity.

Therefore, a primary object of the present invention is to provide a nebulization control system for an ultrasonic nebulizer, which provides a constant and accurate particle size control over the nebulized fluid even when the quantity to be nebulized is small, thereby to produce a fine mist of medicament or the like.

It is a further object of the present invention to provide a nebulization control system which requires only a small rash current and entails a relatively small power consumption for nebulization.

Essentially speaking, the nebulization control system of this invention is such that an ultrasonic vibrator is held in partially excited state and the oscillation circuit output is increased from a non-nebulization level to a nebulization level and decreased from the latter level to the former in repetation so as to control the quantity and degree of nebulization.

DETAILED DESCRIPTION OF THE PREFERRED EMBODIMENT

Figure 1:
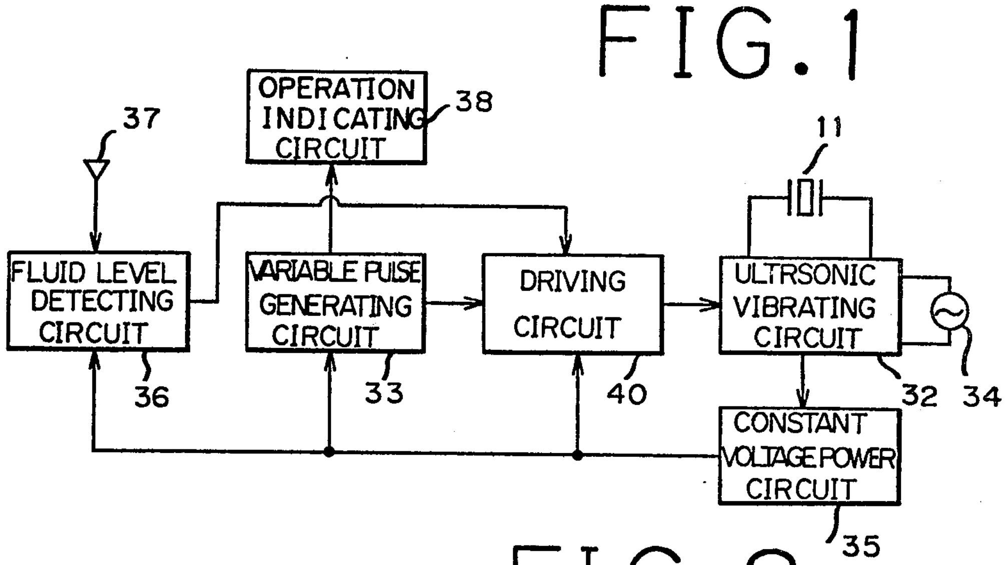
FIG. 1 is a block diagram of the nebulizing control system for an ultrasonic nebulizer according to the present invention.

Referring to FIG. 1, an ultrasonic vibrating circuit 32 comprises a rectifying circuit 321 which converts an a.c. voltage from a power source 34 to a d.c. voltage and supplies the latter to a constant voltage circuit 35, and a driving circuit 40 which supplies a high frequency oscillating voltage to an ultrasonic vibrator 11.

The constant voltage circuit 35 supplies the constant d.c. voltage to a fluid level detection circuit 36, a variable pulse generating circuit 33, and the driving circuit 40.

The fluid level detection circuit 36 feeds an operation stop signal to the driving circuit 40 or variable pulse generating circuit 33 for stopping ultrasonic vibration upon detection of the level of the fluid by a detection means 37 when the level has dropped below a predetermined level.

The variable pulse generating circuit 33 continually generates pulses, the interval or amplitude of which is variable as described later, and supplied said pulses to the driving circuit 40 and an operation indicating circuit 30 for indicating the nebulization condition.

Driving circuit 40 causes the ultrasonic vibrating circuit 32 to generate a high frequency vibrating output of relatively large amplitude during the low level interval of the variable pulse, while it generates an output of relatively small amplitude during the high level interval of variable pulse.

The high frequency vibrating output is applied to the ultrasonic vibrator 11 whereupon the latter generates an ultrasonic wave which is available for the nebulization of fluid during the low level interval of variable pulse but not available for nebulization during high level interval of variable pulse, although it keeps the vibrator constantly energized.

Figure 2:
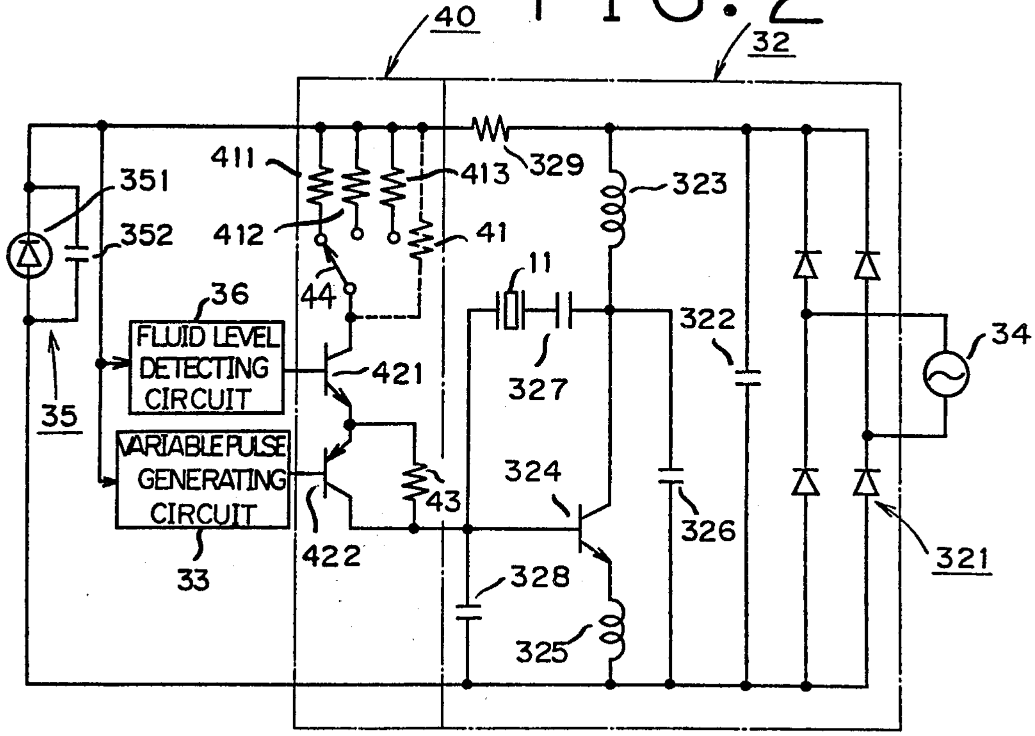
FIG. 2 shows a specific circuitry including the ultrasonic vibrating circuit and driving circuit shown in FIG. 1.

FIG. 2 is an electric circuitry showing a specific connection between the ultrasonic vibrating circuit 32 and driving circuit 40.

The ultrasonic vibrating circuit 32 comprises a full-wave rectifying circuit 321 for rectifying the a.c. supplied from the a.c. power source 34.

Connected to output terminals of the full-wave rectifying circuit 321 are a high frequency bypassing capacitor 322 and a series connection of a coil 323, a power transistor 324, and another coil 325. A capacitor 326 is connected between the collector of a power transistor 324 and a ground line. Ultrasonic vibrator 11 and capacitor 327 connected in series are connected between the base and collector of the transistor 324, and a capacitor 328 is connected between the base and the ground line.

A constant voltage circuit 35 is connected to the output terminals of the rectifying circuit 321 through a resistor 329, which comprises a Zener diode 351 and a smoothing capacitor 352 connected in parallel.

The driving circuit 40 comprises a resistor 41, a transistor 421, and 422 connected in series, which is connected between the positive line of the constant voltage circuit 35 and the base of transistor 324.

A resistor 43 is connected in parallel with the transistor 422. Transistor 421 becomes OFF on reception of a detection signal representing a shortage of fluid from the fluid level detecting circuit 36 to thereby stop the vibration of ultrasonic vibrating circuit 32.

Figure 4:
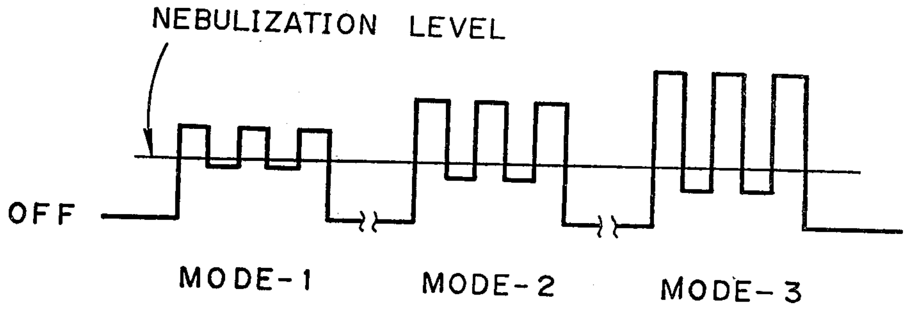
FIG. 4 shows another output wave form of the ultrasonic vibrator.

It is preferable, for enabling a free choice of different ultrasonic vibration output levels within the nebulization range, to connect one end each of resistors 411, 412, and 413 of different resistance values to the positive line of the constant voltage circuit 35 and connect the other ends to a selecting switch 44 (see FIGS. 2 and 4).

Figure 3:
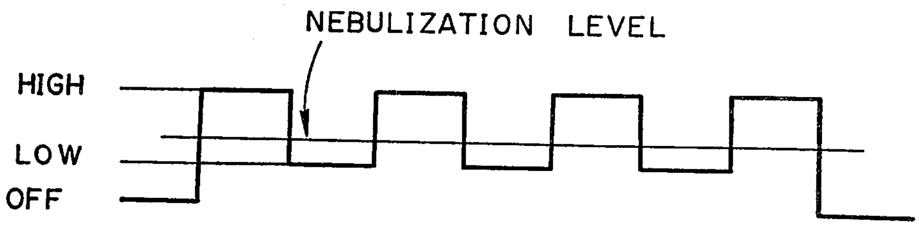
FIG. 3 shows an output wave form of the ultrasonic vibrator according to the present invention.

FIG. 3 shows the wave-form of output pulses, i.e. intervals of ultrasonic vibration, from the driving circuit 40, wherein a resistor 41 is inserted so as to provide a uniform ultrasonic vibration level within the range of nebulization.

The operation of the nebulization control system according to the present invention will now be described in detail with reference to FIG. 1 through FIG. 4.

Fluid level detecting circuit 36 holds the transistor 421 in "ON" condition unless an abnormality is detected.

Variable pulse generating circuit 33, which consists of a known variable means for changing the duty factor of pulses, in other words, duration and frequency of pulses, feeds pulses of predetermined frequency to the base of transistor 422, which is turned on when the level of input pulse is low, so that a relatively large input current is supplied to the power transistor 324.

Ultrasonic vibrating circuit 32 functions as a Colpitts oscillating circuit and supplies to the ultrasonic vibrator 11 an oscillating output of relatively large amplitude, during the variable pulse is of low level, so that the ultrasonic vibrator 1 generates an ultrasonic vibrating output which is sufficient to nebulize the fluid.

When the variable pulse from the variable pulse oscillating circuit 33 attains a high level, the transistor 422 is turned off.

If resistor 43 has not been inserted, no current is supplied to the base of transistor 324 and the ultrasonic vibrating circuit 32 is not actuated.

Since resistor 43 is connected to the transistor 422 in parallel, a small current is supplied to the base of power transistor 324 through resistors 329 and 41, the collector and emitter of transistor 421, and resistor 43, so that ultrasonic vibrator 11 generates an ultrasonic wave of relatively small amplitude which is in the range of non-nebulization, for example, one third of the full nebulization amplitude.

After this, depending on the output level of the variable pulse oscillating circuit 32, a relatively large output and a relatively small output of ultrasonic vibration are generated alternatingly to nebulize the fluid or to keep the fluid not to be nebulized.

Since the ultrasonic vibrator 11 is thus held in constantly energized state and the vibrator output is caused to vary from a non-nebulization level, which is higher than the prior art level corresponding to the non-excited state of the ultrasonic vibrator, to a nebulization level or vice versa in synchronization of the output pulse of the pulse generating circuit 33, the amount of rush current is so much reduced, with the result that the scattering of fluid by a large rush current is prevented and a fine uniform mist of fluid particles is produced.

In the above mentioned embodiment, the quantity can be nebulization variably controlled by changing the duty factor of output pulses from variable pulse generating circuit 33.

FIG. 4 shows the wave-forms of ultrasonic vibrating output which are obtainable as resistors 411 through 413, in place of resistor 41, are switched by means of the selecting switch 44.

Resistor 411 has a relatively large resistance, resistor 412 has an intermediate resistance, and resistor 413 has a relatively small resistance.

When resistor 411 has been selected, that is, in Mode-1 shown in FIG. 4, a relatively small current is supplied to the base of power transistor 324 during the low level of variable pulse which turns on the transistor 422, and ultrasonic vibrating circuit 32 causes ultrasonic vibrator 11 to vibrate in a sufficient range to cause nebulization of a small quantity of fluid.

On the other hand, during the high level of variable pulse which turns off the transistor 422, a small current, which is defined by the resistance of resistor 43, is supplied to the base of power transistor 324 and the ultrasonic vibrating circuit 32 causes the ultrasonic vibrator 11 to vibrate in the range of non-nebulization.

When resistor 412 has been selected by the selecting switch 44, i.e. in Mode-2 shown in FIG. 4, during the low level of variable pulse, the base current of intermediate value which is sufficient to nebulize the fluid is supplied to the power transistor 324, while, during the high level of variable pulse, a small base current which is insufficient to nebulize the fluid is supplied to the transistor 324, so that the ultrasonic vibration of an intermediate level for the nebulization of an intermediate quantity is generated.

When resistor 413 has been selected with the selecting switch 44, i.e. in Mode-3 shown in FIG. 4, during the low level of variable pulse, a relatively large base current which is sufficient to nebulize the fluid is supplied to the power transistor 324, while, during the high level of variable pulse, a very small current defined by the resistance value of resistor 43 is supplied to the transistor 324, so that a large quantity of fluid is nebulized.

The adoption of such an amplitude variation and a duty factor changing is desirable for a precise control of nebulization.

What is claimed is:

1. A nebulization control system for an ultrasonic nebulizer, comprising:

a variable pulse oscillating circuit, an ultrasonic vibrating circuit, the vibration amplitude of which depends upon the output of said variable pulse oscillating circuit, and an ultrasonic vibrator which is energized by the output of said ultrasonic vibrating circuit, wherein said ultrasonic vibrator is caused to vibrate in alternation between a predetermined high amplitude level which is sufficient to nebulize fluid and a predetermined low amplitude level, greater than zero, which is at or near the maximum amplitude at which nebulization will not take place.

2. A nebulization control system for an ultrasonic nebulizer according to claim 1, wherein the ratio of the duration of vibration of said high level to that of said low level is variable.

3. A nebulization control system for an ultrasonic nebulizer according to claim 1, wherein the amplitude of vibration at said high level is variable.

4. A nebulization control system for an ultrasonic nebulizer according to claims 1, 2, or 3, wherein the difference in amplitude between the high level and the low level is chosen to produce a predetermined nebulization quantity.

5. A nebulization control system for an ultrasonic nebulizer according to claims 1, 2, or 3, wherein the low level amplitude is one-third the high level amplitude.

* * * * *